United States Patent
Sayilir et al.

(10) Patent No.: US 10,122,332 B2
(45) Date of Patent: Nov. 6, 2018

(54) LOW-NOISE AMPLIFIER WITH INTEGRATED WIDEBAND TRANSFORMER-BASED POWER SPLITTER

(71) Applicant: QUALCOMM Incorporated, San Diego, CA (US)

(72) Inventors: Serkan Sayilir, San Diego, CA (US); Chuan Wang, San Diego, CA (US); Kevin Hsi Huai Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/607,145

(22) Filed: May 26, 2017

(65) Prior Publication Data

US 2018/0167040 A1 Jun. 14, 2018

Related U.S. Application Data

(60) Provisional application No. 62/434,378, filed on Dec. 14, 2016.

(51) Int. Cl.
| | |
|---|---|
| H03F 1/00 | (2006.01) |
| H03F 3/191 | (2006.01) |
| H03F 3/30 | (2006.01) |
| H03F 3/26 | (2006.01) |
| H03H 7/48 | (2006.01) |
| H03F 3/00 | (2006.01) |
| H03F 3/72 | (2006.01) |
| H04B 1/18 | (2006.01) |
| H04L 27/26 | (2006.01) |

(52) U.S. Cl.
CPC .............. *H03F 3/191* (2013.01); *H03F 3/005* (2013.01); *H03F 3/26* (2013.01); *H03F 3/3098* (2013.01); *H03F 3/72* (2013.01); *H03H 7/487* (2013.01); *H04B 1/18* (2013.01); *H04L 27/2647* (2013.01)

(58) Field of Classification Search
CPC ........ H03F 3/68; H03F 3/195; H03F 2200/06; H03F 2200/09
USPC ........ 330/124 R, 195, 301; 455/292; 333/25, 333/26
See application file for complete search history.

(56) References Cited

U.S. PATENT DOCUMENTS

| | | | |
|---|---|---|---|
| 6,806,768 B2 * | 10/2004 | Klaren | H03F 3/602 330/124 R |
| 7,405,695 B2 | 7/2008 | Liu | |
| 7,741,904 B2 | 6/2010 | Ichitsubo et al. | |
| 8,604,874 B2 * | 12/2013 | Bendixen | H03F 3/195 330/124 R |
| 9,070,506 B2 | 6/2015 | Anderson et al. | |
| 9,160,598 B2 | 10/2015 | Davierwalla et al. | |
| 9,236,892 B2 | 1/2016 | Dupuy et al. | |
| 9,425,832 B2 | 8/2016 | Youssef et al. | |

(Continued)

*Primary Examiner* — Steven J Mottola
(74) *Attorney, Agent, or Firm* — Qualcomm Incorporated/Seyfarth Shaw LLP

(57) ABSTRACT

A wireless communication device includes a first low-noise amplifier (LNA). The wireless communication device also includes a first LNA load circuit coupled to an output of the LNA. The wireless communication device further includes a power splitter switchably coupled to the first LNA load circuit. The power splitter includes a negatively coupled transformer and is switchably coupled to multiple outputs.

20 Claims, 7 Drawing Sheets

(56) References Cited

U.S. PATENT DOCUMENTS

| | | |
|---|---|---|
| 9,431,963 B2 | 8/2016 | Wang et al. |
| 2017/0201218 A1 | 7/2017 | Wang et al. |

* cited by examiner

LOW-NOISE AMPLIFIER WITH INTEGRATED WIDEBAND TRANSFORMER-BASED POWER SPLITTER

CROSS-REFERENCE TO RELATED APPLICATION

The present application claims the benefit of U.S. Provisional Patent Application No. 62/434,378, filed on Dec. 14, 2016, and titled "LOW-NOISE AMPLIFIER WITH INTEGRATED WIDEBAND TRANSFORMER-BASED POWER SPLITTER," the disclosure of which is expressly incorporated by reference herein in its entirety.

BACKGROUND

Field

The present disclosure relates generally to electronic devices. More specifically, the present disclosure relates to low-noise amplifiers with a wideband transformer-based power splitter.

Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc.

Receive (RX) carrier aggregation (CA) involves an incoming RF signal that consists of an aggregate of two or more component carriers and uses a single input multiple output low-noise amplifier (LNA) for intra-CA, for instance. Unfortunately, conventional architectures that support carrier aggregation consume a significant chip area and are area inefficient. The conventional architectures also suffer from linearity, noise factor, or isolation degradation.

SUMMARY

In an aspect of the present disclosure, a wireless communication device is presented. The wireless communication device includes a first low-noise amplifier (LNA). The wireless communication device also includes a first LNA load circuit coupled to an output of the LNA. The wireless communication device further includes a power splitter switchably coupled to the first LNA load circuit. The power splitter has a negatively coupled transformer and is switchably coupled to multiple outputs.

In another aspect of the present disclosure, a method for isolating outputs in a wireless communication device is presented. The method includes selectively supplying an amplified signal to one or more outputs or to a power splitter. The method also includes isolating the one or more outputs when the amplified signal is supplied to the power splitter.

In yet another aspect of the present disclosure, a wireless communication device is presented. The wireless communication device includes means for selectively supplying an amplified signal to one or more outputs or to a power splitter. The wireless communication device also includes means for isolating the one or more outputs when the amplified signal is supplied to the power splitter.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

DETAILED DESCRIPTION

The detailed description set forth below in connection with the appended drawings is intended as a description of exemplary embodiments and is not intended to represent the only embodiments that can be practiced. The term "exemplary" used throughout this description means "serving as an example, instance, or illustration," and should not necessarily be construed as preferred or advantageous over other exemplary embodiments. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

The detailed description includes specific details for the purpose of providing a thorough understanding of the exemplary embodiments. It will be apparent to those skilled in the art that the exemplary embodiments may be practiced without these specific details. In some instances, well-known structures and devices are shown in block diagram form in order to avoid obscuring the novelty of the exemplary embodiments presented herein. Other aspects, as well as features and advantages of various aspects, will become apparent to those of skill in the art through consideration of the ensuing description, the accompanying drawings and the appended claims.

Figure 1:
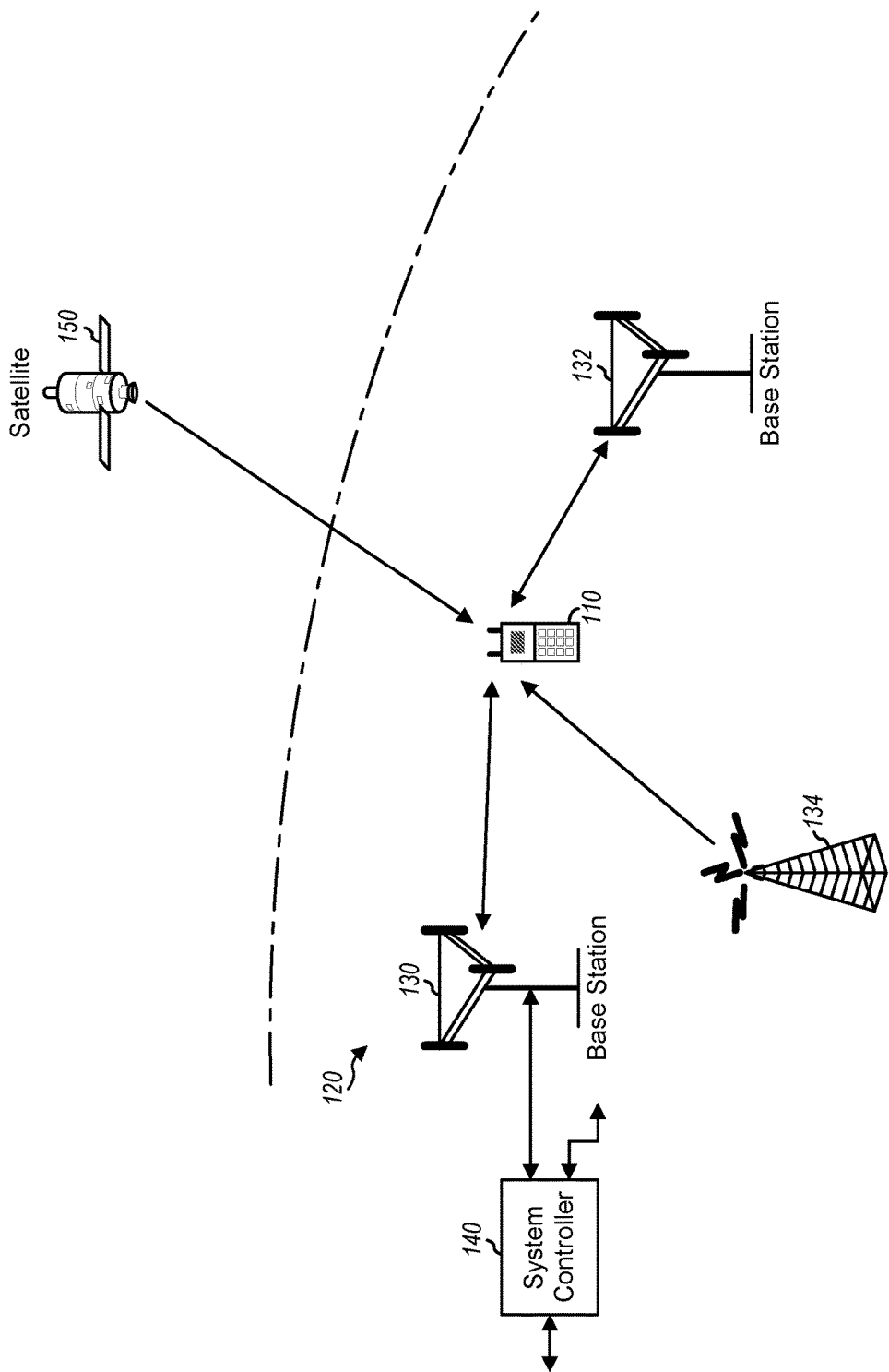
FIG. 1 shows a wireless device communicating with a wireless system, according to an aspect of the present disclosure.

FIG. 1 shows a wireless device 110 communicating with a wireless communication system 120. The wireless system 120 may be a long term evolution (LTE) system, a 5th generation wireless system (5G), a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless system 120 including two base stations 130 and 132 and one system controller 140. In general, a wireless system may include any number of base stations and any number of network entities.

The wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may be capable of communicating with the wireless system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to 5 carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

Figure 2A:
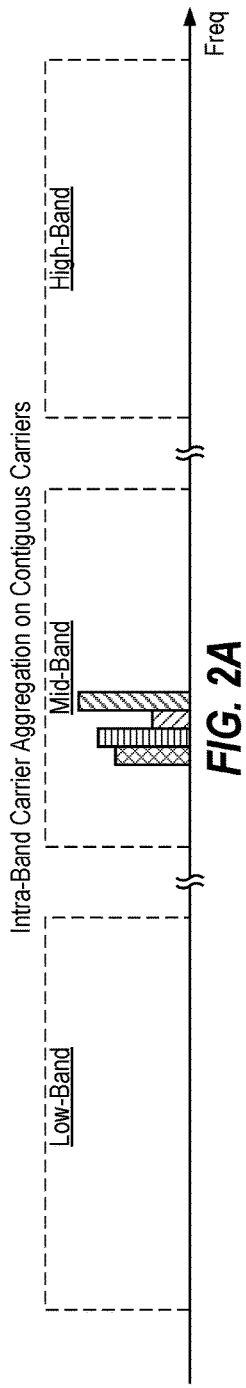
FIGS. 2A-2D show four examples of carrier aggregation, according to aspects of the present disclosure.

FIG. 2A shows an example of contiguous intra-band CA. In the example shown in FIG. 2A, a wireless device (e.g., the wireless device 110) is configured with four contiguous carriers in the same band, which is a band in mid-band. The wireless device may send and/or receive transmissions on multiple contiguous carriers within the same band.

Figure 2B:
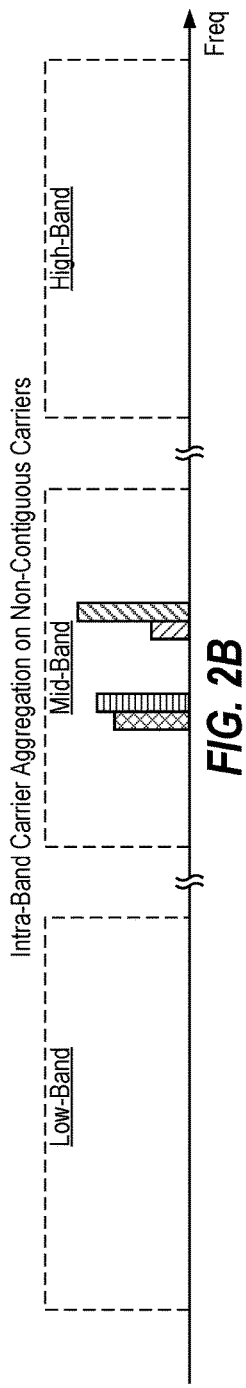

FIG. 2B shows an example of non-contiguous intra-band CA. In the example shown in FIG. 2B, a wireless device (e.g., the wireless device 110) is configured with four non-contiguous carriers in the same band, which is a band in mid-band. The carriers may be separated by 5 MHz, 10 MHz, or some other amount. The wireless device may send and/or receive transmissions on multiple non-contiguous carriers within the same band.

Figure 2C:
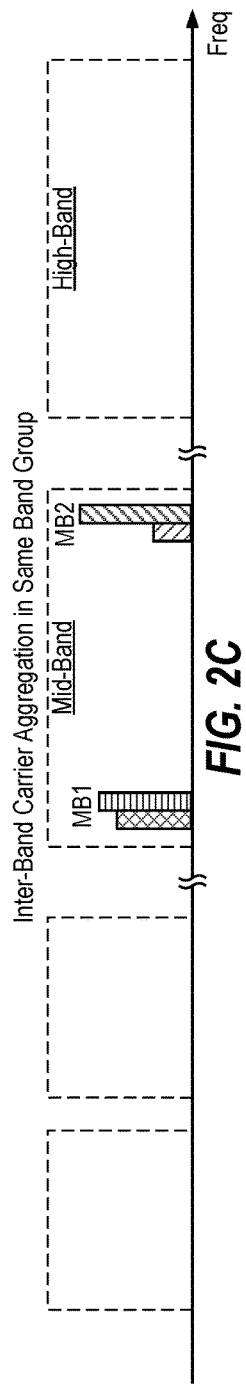

FIG. 2C shows an example of inter-band CA in the same band group. In the example shown in FIG. 2C, a wireless device (e.g., the wireless device 110) is configured with four carriers in two bands in the same band group, which is mid-band. The wireless device may send and/or receive transmissions on multiple carriers in different bands in the same band group (e.g., Mid-Band 1 (MB1) and Mid-Band 2 (MB2) in FIG. 2C).

Figure 2D:
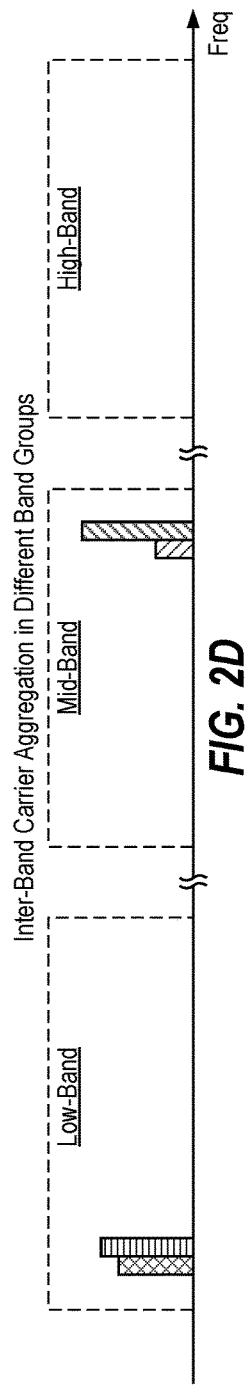

FIG. 2D shows an example of inter-band CA in different band groups. In the example shown in FIG. 2D, a wireless device (e.g., the wireless device 110) is configured with four carriers in two bands in different band groups, which include two carriers in one band in low-band and two additional carriers in another band in mid-band. The wireless device may send and/or receive transmissions on multiple carriers in different bands in different band groups (e.g., low-band and mid-band in FIG. 2D). FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long-term evolution in unlicenced spectrum (LTE-U).

Figure 3:
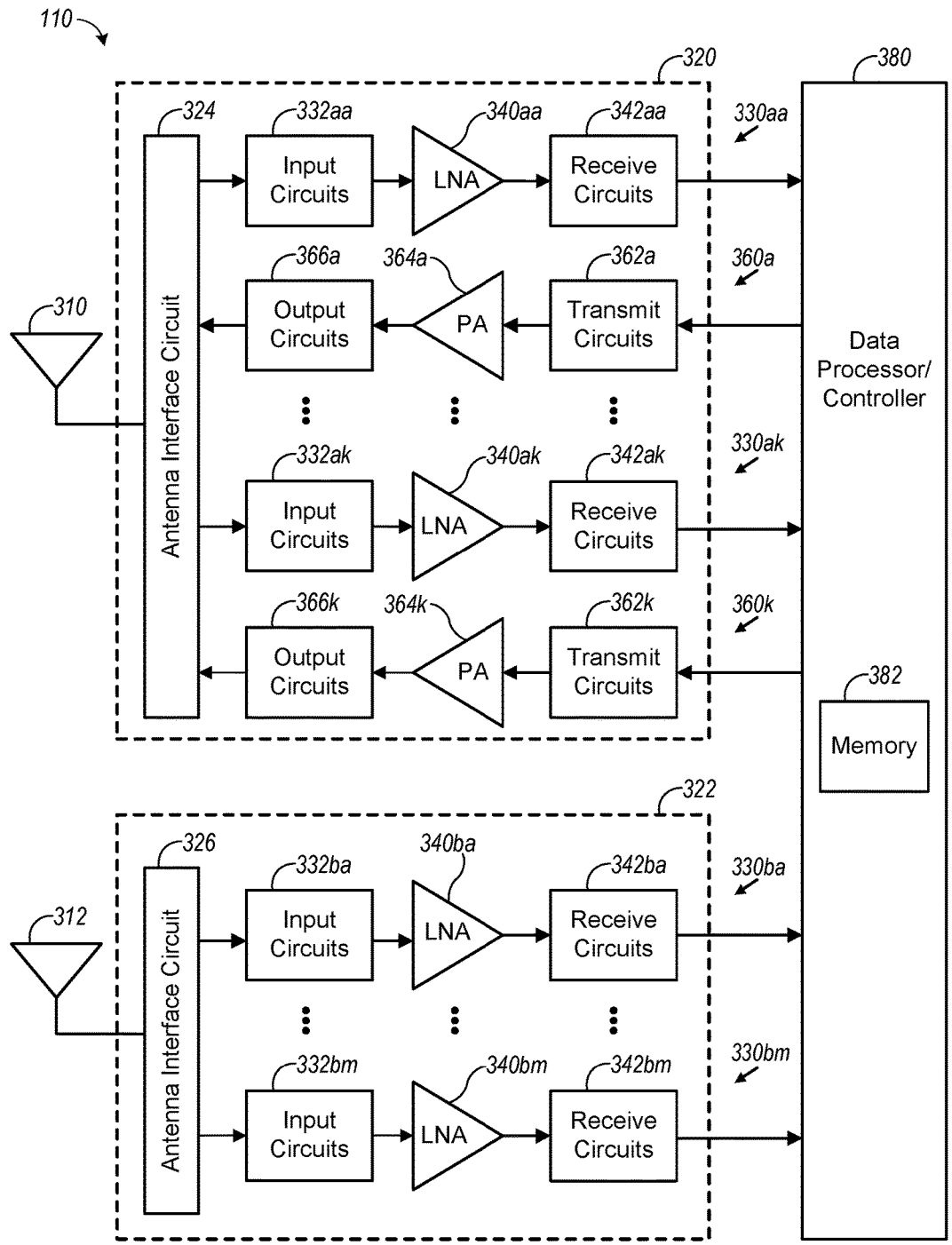
FIG. 3 shows a block diagram of the wireless device in FIG. 1, according to an aspect of the present disclosure.

FIG. 3 shows a block diagram of an exemplary design of the wireless device 110 in FIG. 1. In this exemplary design, the wireless device 110 includes a transceiver 320 coupled to a primary antenna 310, receivers 322 coupled to a secondary antenna 312, and a data processor/controller 380. The transceiver 320 includes multiple (K) receivers 330aa to 330ak and multiple (K) transmitters 360a to 360k to support multiple bands, carrier aggregation, multiple radio technologies, etc. The receivers 322 include multiple (M) receivers 330ba to 330bm to support multiple bands, carrier aggregation, multiple radio technologies, receive diversity, MIMO transmission from multiple transmit antennas to multiple receive antennas, etc.

In the exemplary design shown in FIG. 3, each receiver 330 includes input circuits 332, a low-noise amplifier (LNA) 340, and receive circuits 342. For data reception, the antenna 310 receives signals from base stations and/or other transmitter stations and provides a received RF signal, which is routed through an antenna interface circuit 324 and provided to a selected receiver. The antenna interface circuit 324 may include switches, duplexers, transmit filters, receive filters, etc. The description below assumes that the receiver 330aa is the selected receiver. Within the receiver 330aa, the received RF signal is passed through input circuits 332aa, which provides an input RF signal to an LNA 340aa. Input circuits 332aa may include a matching circuit, a receive filter, etc. The LNA 340aa amplifies the input RF signal and provides an output RF signal. Receive circuits 342aa amplify, filter, and downconvert the output RF signal from RF to baseband and provide an analog input signal to data processor 380. Receive circuits 332 aa may include mixers, filters, amplifiers, matching circuits, an oscillator, a local oscillator (LO) generator, a phase locked loop (PLL), etc. Each remaining receiver 330 in the transceiver 320 and each receiver 330 in the receivers 322 may operate in a similar manner as the receiver 330aa in the transceiver 320.

In the exemplary design shown in FIG. 3, each transmitter 360 includes transmit circuits 362, a power amplifier (PA) 364, and output circuits 366. For data transmission, a data processor 380 processes (e.g., encodes and modulates) data to be transmitted and provides an analog output signal to a selected transmitter. The description below assumes that the transmitter 360a is the selected transmitter. Within the transmitter 360a, transmit circuits 362a amplify, filter, and upconvert the analog output signal from baseband to RF and provide a modulated RF signal. Transmit circuits 362a may include amplifiers, filters, mixers, matching circuits, an oscillator, an LO generator, a PLL, etc. A PA 364a receives and amplifies the modulated RF signal and provides a transmit RF signal having the proper output power level. The transmit RF signal is passed through output circuits 366a, routed through the antenna interface circuit 324, and transmitted via the antenna 310. Output circuits 366a may include a matching circuit, a transmit filter, a directional coupler, etc.

FIG. 3 shows an exemplary design of receivers 330 and transmitters 360. A receiver and a transmitter may also include other circuits not shown in FIG. 3, such as filters, matching circuits, etc. All or a portion of the transceiver 320 and receivers 322 may be implemented on one or more analog integrated circuits (ICs), RF ICs (RFICs), mixed-signal ICs, etc. For example, LNAs 340, receive circuits 342, and transmit circuits 362 may be implemented on one module, which may be an RFIC, etc. Antenna interface circuits 324 and 326, input circuits 332, output circuits 366, and PAs 364 may be implemented on another module, which may be a hybrid module, etc. The circuits in the transceiver 320 and receivers 322 may also be implemented in other manners.

The data processor/controller 380 may perform various functions for the wireless device 110. For example, the data processor 380 may perform processing for data received via the receivers 330 and data transmitted via the transmitters 360. The controller 380 may control the operation of antenna interface circuits 324 and 326, input circuits 332, LNAs 340, receive circuits 342, transmit circuits 362, PAs 364, output circuits 366, or a combination thereof. A memory 382 may store program codes and data for the data processor/controller 380. The data processor/controller 380 may be implemented on one or more application specific integrated circuits (ASICs) and/or other ICs.

The wireless device 110 may receive transmissions from one or more base stations/cells on multiple carriers at different frequencies for carrier aggregation. For intra-band CA, the transmissions are sent on different carriers in the same band. For inter-band CA, the transmissions are sent on multiple carriers in different bands.

Figure 4:
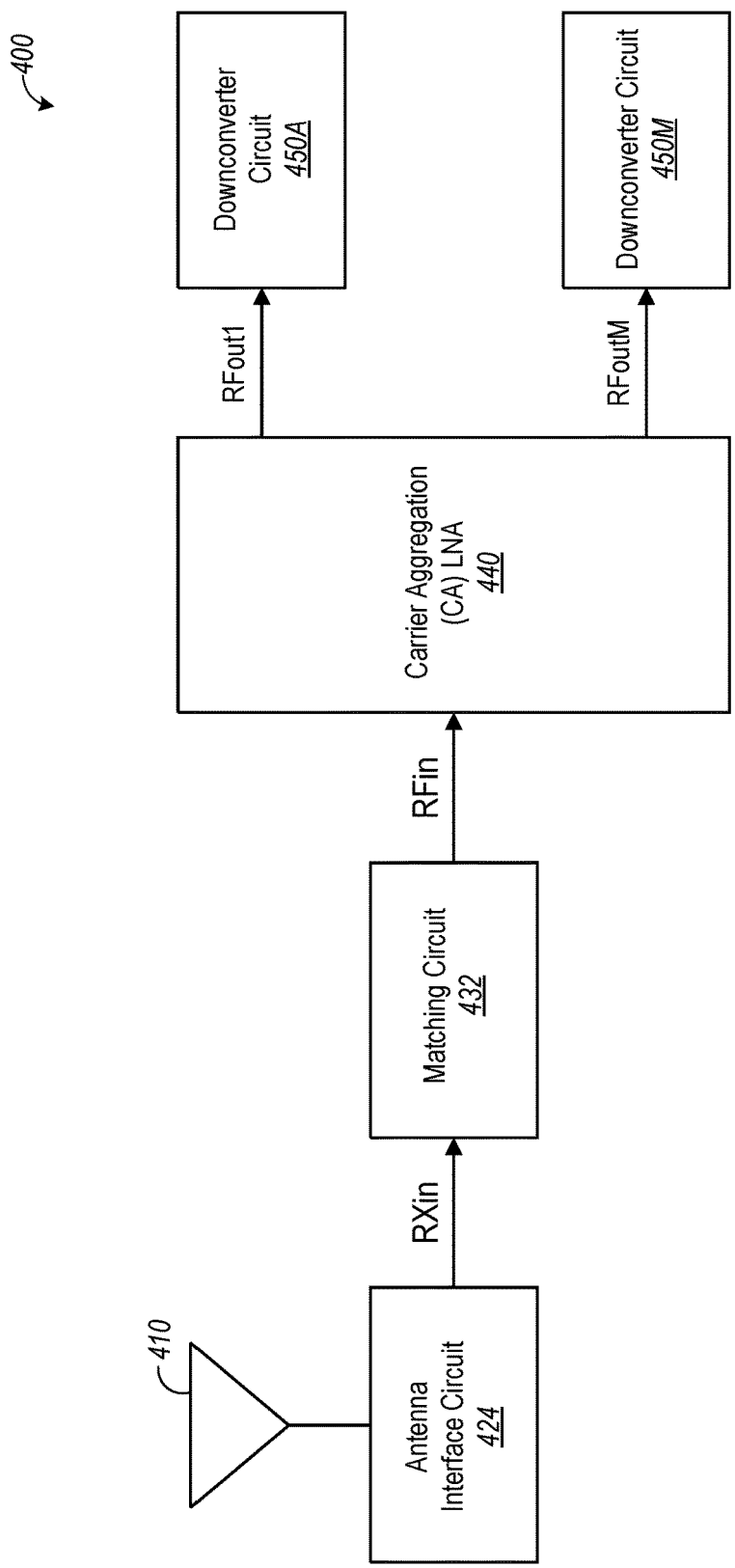
FIG. 4 shows a receiver supporting carrier aggregation, in accordance with an aspect of the present disclosure.

FIG. 4 shows a block diagram of an exemplary design of a receiver 400 with a carrier aggregation (CA) low-noise amplifier (LNA) 440 configured to support intra-band or inter-band CA. The CA LNA 440 may be used for one or more LNAs 340 shown in FIG. 3. The CA LNA 440 includes single input and multiple (M) outputs, where M>1.

At the receiver 400, an antenna 410 may receive downlink signals comprising one or more transmissions sent on one or more carriers and provide a received RF signal to an antenna interface circuit 424. The antenna interface circuit 424 may filter and route the received RF signal and provide a receiver input signal, RXin. An input matching circuit 432 may receive the RXin signal and provide an input RF signal, RFin, to the CA LNA 440. A matching circuit 432 may perform impedance and/or power matching between the CA LNA 440 and either the antenna interface circuit 424 or the antenna 410 for a band of interest. The matching circuit 432 may be part of one of the input circuits 332 in FIG. 3.

The CA LNA 440 may receive and amplify the input RFin signal and provide (i) one output RF signal via one LNA output for either no CA or CA on one set of carriers or (ii) up to M output RF signals, RFout1 to RFoutM, via up to M LNA outputs for intra-band CA on up to M sets of carriers. In some aspects, the receiver 400 may comprise a wideband LNA with a bandwidth defined to accommodate or facilitate inter-band CA using an LNA. For example, the CA LNA 440 may receive multiple inputs and generate multiple outputs to support inter-band carrier aggregation within one LNA, which utilizes wide matching bandwidth and also limits the isolation between inter-band carriers. M downconverter circuits 450A to 450M are coupled to the M LNA outputs. Each downconverter circuit 450, when enabled, may downconvert an associated output RF signal such that one or more transmissions on one or more carriers of interest are downconverted from RF to baseband.

A CA LNA, such as the CA LNA 440 in FIG. 4, may operate in a single-output mode or a multi-output mode at any given moment. In the single-output mode, the CA LNA operates in a 1-input to 1-output (1×1) configuration, and receives one input RF signal comprising one or more transmissions on one set of carriers, and provides one output RF signal to one downconverter circuit. The single-output mode may be used to receive a transmission sent on a single carrier without carrier aggregation. The single-output mode may also be used to receive transmissions sent on multiple carriers (e.g., contiguous carriers) with carrier aggregation. In this case, the transmissions on all carriers may be down-converted with a single local oscillator (LO) signal at a single frequency. In the multi-output mode, the CA LNA operates in a 1×M configuration, receives one input RF signal comprising multiple transmissions on M sets of carriers, and provides M output RF signals to M downconverter circuits, one output RF signal for each set of carriers, where M>1. Each set of carriers may include one or more carriers in a single band (e.g., intra-band CA) or across multiple bands (e.g., inter-band CA).

LNA with Integrated Wideband Transformer-Based Power Splitter

Conventional architectures in multi-band intra-CA mode have gain/noise figure/linearity/isolation tradeoffs. These architectures also consume higher power or use large die area and thus are expensive. Aspects of the present disclosure are directed to a multi-band intra-CA low-noise amplifier (LNA) using a wideband transformer-based power splitter.

Figure 5:
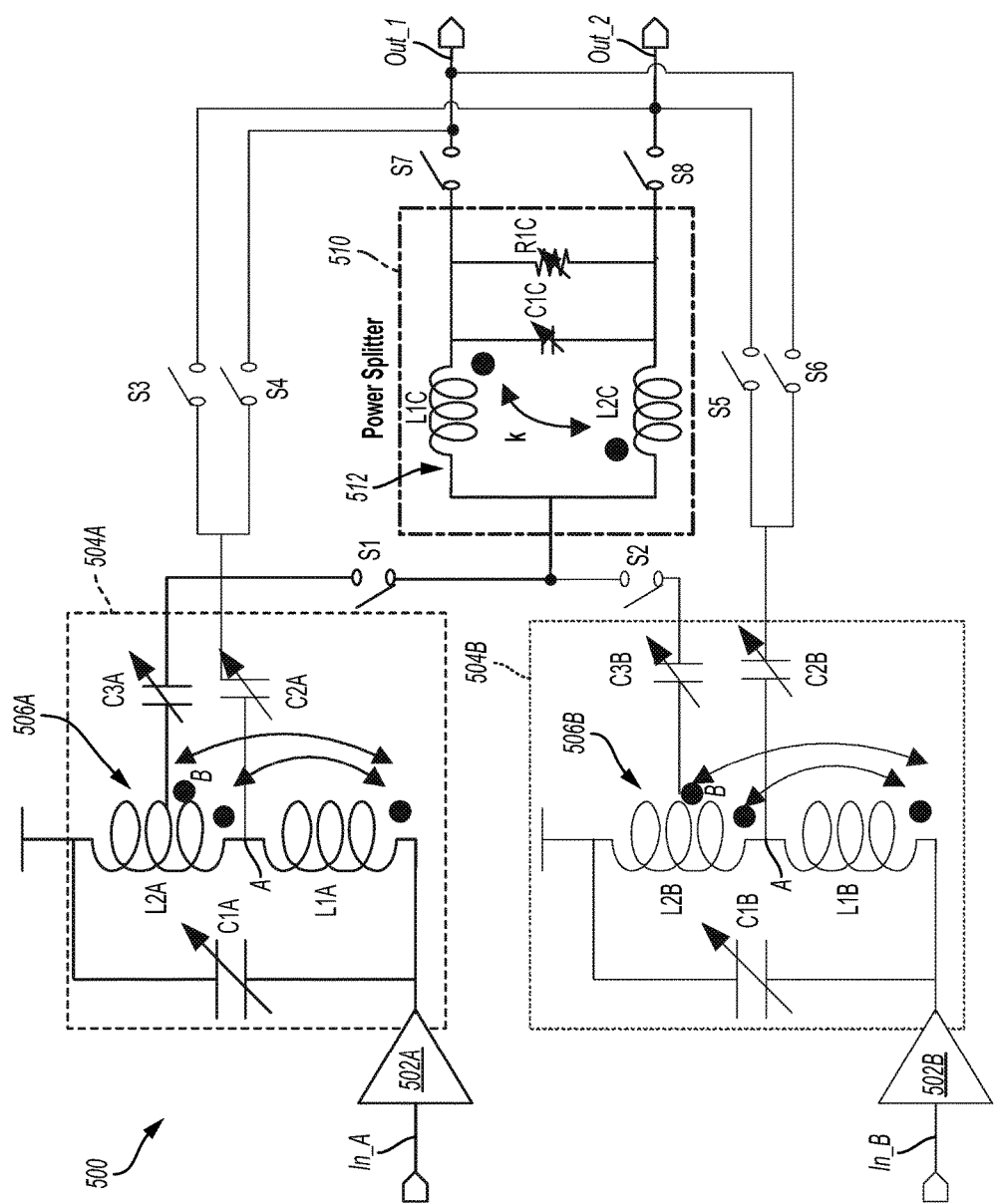
FIG. 5 is a schematic diagram illustrating an exemplary device in accordance with aspects of the present disclosure.

FIG. 5 is a schematic diagram illustrating an exemplary device 500 in accordance with aspects of the present disclosure. Referring to FIG. 5, the device 500 includes a first LNA 502A which receives an input In_A. The output of the first LNA 502A is coupled to an LNA load circuit 504A. The LNA load circuit 504A includes a variable capacitor C1A (e.g., multiple sections, butterfly, split stator, or differential) and a transformer 506A. The transformer 506A includes an inductor L1A and an inductor L2A. In some aspects, the transformer 506A may be tapped. By way of example, the transformer 506A includes a tap at the input of the first coil (e.g., inductor L1A) and two taps at different points or locations of the second coil (e.g., inductor L2A). In some aspects, a first tapping point of the second coil (A) may be matched to one of the outputs (e.g., Out_1, Out_2) and a second tapping point of the second coil (B) may be matched to the power splitter 510. By providing multiple taps on the second coil, the impedance may be reduced to provide improved isolation performance. Of course, other configurations of the LNA load circuit are also possible. For example, in some aspects, the LNA load circuit 504A may be configured using resistors for matching, by removing a capacitor (e.g., C1A), or using other equivalent circuits thereof for the LNA load circuit 504A. In some aspects, the device 500 may perform matching without a transformer, without a capacitor, or can use a resistor, or other equivalent circuits.

The LNA load circuit 504A may further include a variable capacitor C2A coupled to a node A between inductors L1A and L2A and a variable capacitor C3A coupled to the inductor L2A. The capacitor C2A is coupled to device outputs Out_1 and Out_2 via switches S3 and S4, respectively. The capacitor C3A is coupled to a power splitter 510 via a switch S1.

The device 500 may also include a second LNA 502B. The second LNA 502B receives an input In_B (e.g., a radio frequency signal) and produces an output, which is supplied to an LNA load circuit 504B. The LNA load circuit 504B includes a variable capacitor C1B and a transformer 506B, which includes an inductor L1B (e.g., first coil) and an inductor L2B (e.g., second coil). Like the transformer 506A, the transformer 506B may, in some aspects, include multiple taps. As shown in FIG. 5, for example, the second coil (e.g., inductor L2B) includes two taps at different positions of the coil.

The LNA load circuit 504B also includes a variable capacitor C2B coupled to a node B between the inductors L1B and L2B. The capacitor C2B is coupled to device outputs Out_1 and Out_2 via switches S5 and S6, respectively. The LNA load circuit 504B further includes a variable capacitor C3B, which is coupled to a second tap (upper tap point (B)) of the inductor L2B. The LNA load circuit 504B may be coupled to the power splitter 510 via a switch S2. It is noted that the LNA 502B and LNA load circuit 504B may be used in conjunction with the LNA 502A and LNA load circuit 504A, and may share the power splitter 510, to operate in an intra-band mode, for example.

The power splitter 510 may include a transformer 512, a variable capacitor C1C, and a variable resistor R1C. The transformer 512 may comprise, without limitation, a quarter-wave transformer, a triple-coil transformer, etc. The transformer 512 may include an inductor L1C (e.g., first coil) and an inductor L2C (e.g., second coil). The transformer may be configured such that the coils are negatively coupled and have a coupling factor k. For instance, a tap at the negative terminal of the first coil (e.g., inductor L1C) may be coupled to a tap at the positive terminal of the second coil (e.g., inductor L2C). By incorporating the negatively coupled transformer in the power splitter 510, the power splitter may be automatically tuned. That is, if a signal is applied at the device output Out_1, the current that flows through the transformer 512 will have a 180 degree phase shift. On the other hand, the signal will have no phase shift across the resistor R1C. If the impedance of the resistor R1C matches the impedance of the transformer 512, the signal will be cancelled at the device output Out_2. Thus, there is no voltage signal at the device output Out_2 due to the signal from the device output Out_1. Accordingly, isolation between the outputs Out_1 and Out_2 may be improved.

The transformer 512 is coupled in parallel with the variable resistor R1C and variable capacitor C1C. Furthermore, the power splitter 510 is coupled to outputs Out_1 and Out_2 via a switch S7 and a switch S8, respectively.

The device 500 includes switches S7 and S8, and outputs Out_1 and Out_2. Outputs Out_1 and Out_2 may be configured to couple to another device. For example, each of output Out_1 and output Out_2 may couple to downconversion circuitry. Using the power splitter 510 is beneficial because it offers good signal isolation and linearity.

By combining these output switches S1-S8 with the tunable power splitter 510, the LNAs (e.g., 502A, 502B) may generate multiple outputs together with tunable isolations. The power splitter 510 may also match to the output impedance without adding extra matching networks. Accordingly, isolation performance may be improved and space utilization may be reduced.

In one exemplary aspect, the device 500 may be operated in non-CA mode (legacy mode) or an inter-CA mode. In these modes, each of the LNAs (e.g., 502A, 502B) may receive an input (e.g., an RF signal). The inputs may be amplified via the LNAs (e.g., 502A, 502B) and supplied to a respective LNA load circuit (e.g., 504A, 504B). For each of these exemplary modes, the power splitter 510 may be bypassed. The output of the LNA load circuit (e.g., 504A, 504B) may be supplied to the outputs (e.g., Out_1, Out_2) via bypass switches (e.g., S3, S4, S5, S6). In these modes, the LNA load circuit output may be supplied via a first tapping point of the transformers (e.g., 506A, 506B). The first tapping point (adjacent to node A) may be matched to the outputs. For example, the first tapping point may be selected to match the impedance at each output node (Out_1, Out_2) (e.g., 50Ω).

In another exemplary aspect, the device 500 may be operated in an intra-CA mode. In this example, the LNA load circuits 504A, 504B are coupled to the power splitter 510 via the switches S1 and S2. Each of the LNAs (e.g., 502A, 502B) may receive an input (e.g., an RF signal). The inputs may be amplified via the LNAs (e.g., 502A, 502B) and supplied to the respective LNA load circuit (e.g., 504A, 504B). However, in the intra-CA mode, the outputs of the LNA load circuit may be supplied to the power splitter 510 via the switches S1, S2. Accordingly, the amplified input (output via the LNA load circuit (e.g., 504A, 504B)) is in turn output at outputs Out_1 and Out_2 via the power splitter 510, which includes a negatively coupled transformer to isolate the outputs (e.g., Out_1, Out_2). In the intra_CA mode, the LNA load circuit output may be supplied via a second tapping point (B) of the transformers (e.g., 506A, 506B). The second tapping point (B) may be matched to the power splitter 510. For example, the second tapping point may be selected to match the impedance at input of the power splitter (the negatively coupled transformer 512) (e.g., 25Ω).

Figure 6:
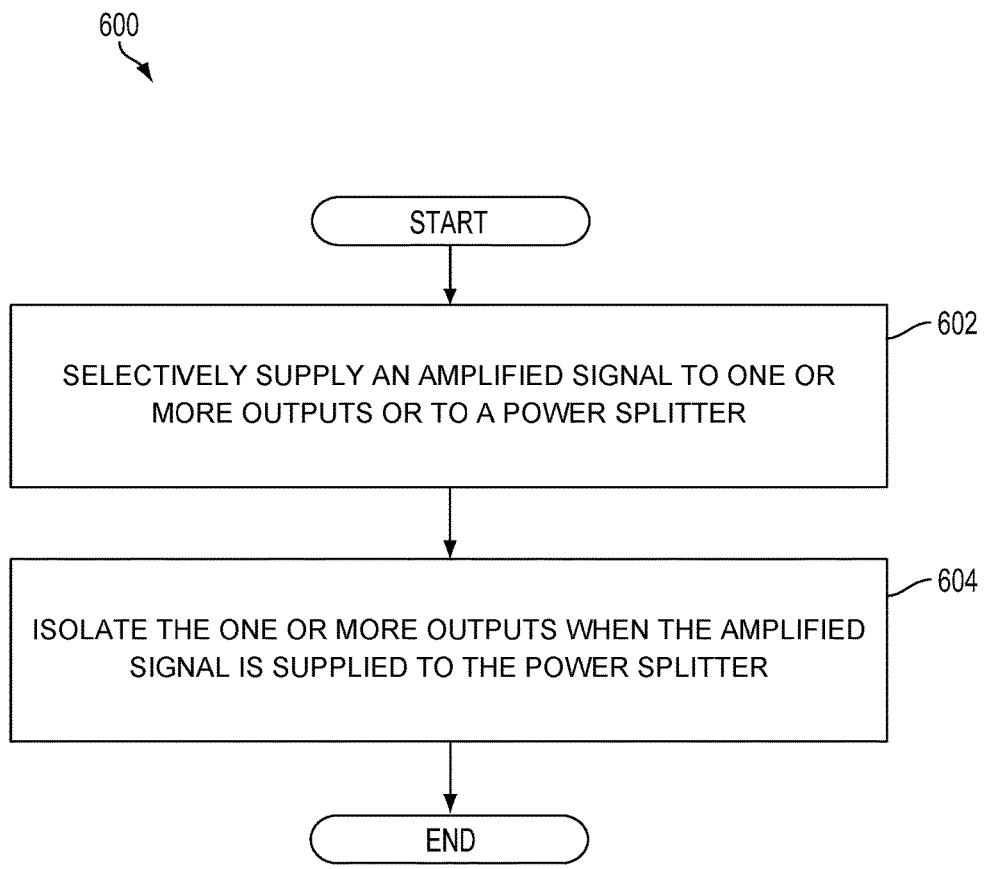
FIG. 6 is a process flow diagram illustrating a method in accordance with aspects of the present disclosure.

FIG. 6 is a process flow diagram illustrating a method 600 for isolating outputs in a wireless communication device in accordance with aspects of the present disclosure. At block 602, the process selectively supplies an amplified signal to one or more outputs or to a power splitter. In some aspects, the amplified signal may be supplied to the one or more outputs or the power splitter based on the mode of operation of a device. For example, the amplified signal may be supplied to the one or more outputs if the device is operating in a non-carrier aggregation or inter-CA mode. On the other hand, if the device is operating in a carrier aggregation mode (e.g., intra-CA), the amplified signal may be supplied to the power splitter to provide isolation between the outputs.

At block 604, the process isolates the one or more outputs when the amplified signal is supplied to the power splitter. For example, as shown in FIG. 5, the power splitter 510 includes a negatively coupled transformer 512, which enables tuning of the power splitter 510 such that isolation between the ouputs Out_1 and Out_2 may be improved. The isolation may be enhanced or improved, in some aspects based on a determined coupling factor (k). In one example configuration, the coupling factor may be set to a value of 0.8 or more based on an analysis of simulation data.

According to a further aspect of the present disclosure, a device including the wideband transformer-based power splitter is described. The device includes means for selectively supplying an amplified signal to one or more outputs or to a power splitter. The means for selectively supplying may, for example, comprise a controller (not shown) LNA load circuit 504A, LNA load circuit 504B, and switches (S1-S8), as shown in FIG. 5. The device also includes means for isolating the one or more outputs when the amplified signal is supplied to the power splitter. The isolating means may, for example, comprise the transformer 512 and power splitter 510 as shown in FIG. 5. In another aspect, the aforementioned means may be any module, or any apparatus configured to perform the functions recited by the aforementioned means.

Figure 7:
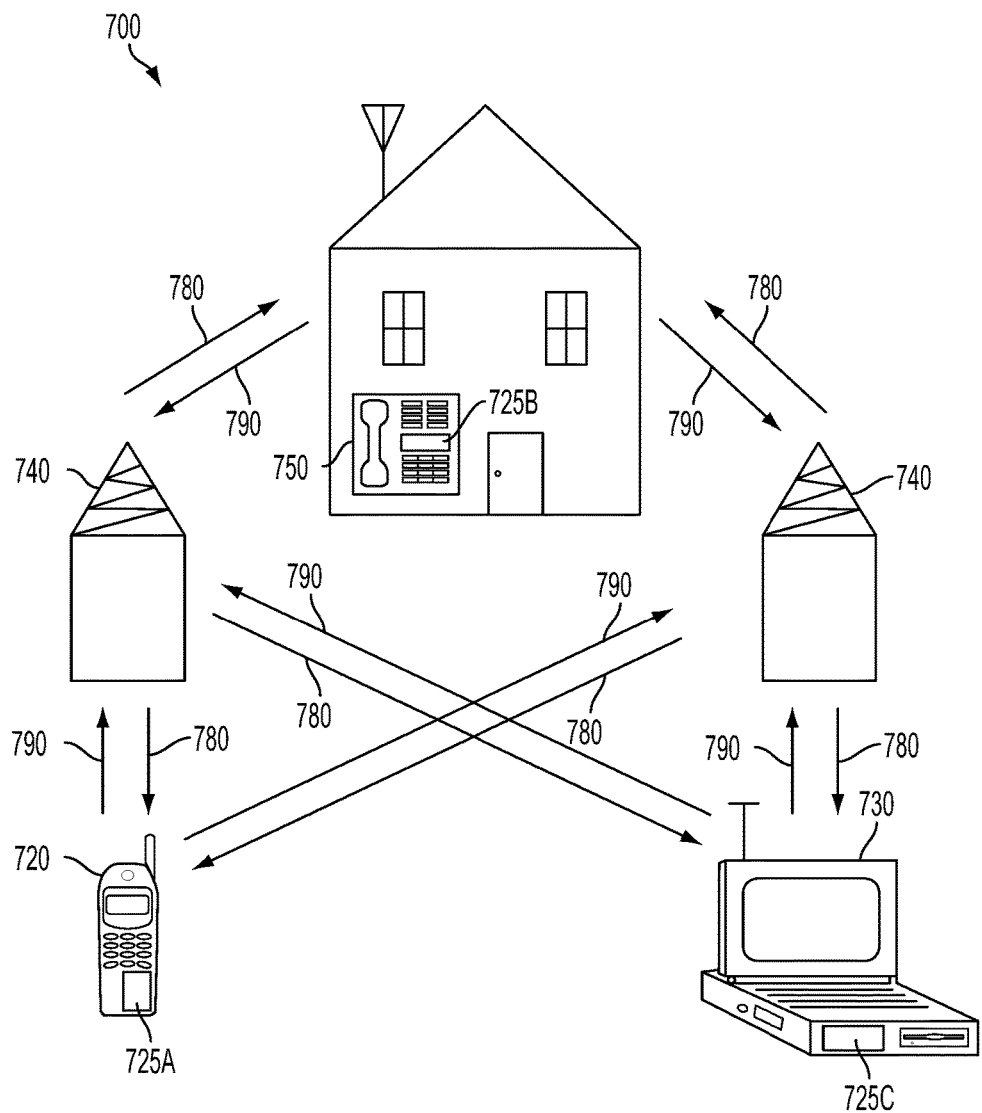
FIG. 7 is a block diagram illustrating an exemplary wireless communication system in which an aspect of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B having the disclosed wideband transformer-based power splitter. It will be recognized that other devices may also include the wideband transformer-based power splitter, such as the base stations, user equipment, and network equipment. FIG. 7 shows forward link signals 780 from the base station 740 to the remote units 720, 730, and 750 and reverse link signals 790 from the remote units 720, 730, and 750 to base station 740.

In FIG. 7, remote unit 720 is shown as a mobile telephone, remote unit 730 is shown as a portable computer, and remote unit 750 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the wideband transformer-based power splitter.

The accompanying claims and their equivalents are intended to cover such forms or modifications as would fall within the scope and spirit of the protection. For example, the example apparatuses, methods, and systems disclosed herein may be applied to multi-SIM wireless devices subscribing to multiple communication networks and/or communication technologies. The various components illustrated in the figures may be implemented as, for example, but not limited to, software and/or firmware on a processor, ASIC/FPGA/DSP, or dedicated hardware. Also, the features and attributes of the specific example aspects disclosed above may be combined in different ways to form additional aspects, all of which fall within the scope of the present disclosure.

The foregoing method descriptions and the process flow diagrams are provided merely as illustrative examples and are not intended to require or imply that the operations of the method must be performed in the order presented. Certain of the operations may be performed in various orders. Words such as "thereafter," "then," "next," etc., are not intended to limit the order of the operations; these words are simply used to guide the reader through the description of the methods.

The various illustrative logical blocks, modules, circuits, and operations described in connection with the aspects disclosed herein may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the various aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of receiver devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable storage medium or non-transitory processor-readable storage medium. The operations of a method or algorithm disclosed herein may be embodied in processor-executable instructions that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable storage media may include random access memory (RAM), read-only memory (ROM), electrically erasable programmable read-only memory (EEPROM), FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable storage medium and/or computer-readable storage medium, which may be incorporated into a computer program product.

Although the present disclosure provides certain example aspects and applications, other aspects that are apparent to those of ordinary skill in the art, including aspects which do not provide all of the features and advantages set forth herein, are also within the scope of this disclosure. Accordingly, the scope of the present disclosure is intended to be defined only by reference to the appended claims.

What is claimed is:

1. A wireless communication device, comprising:
   a first low-noise amplifier (LNA);
   a first LNA load circuit coupled to an output of the LNA; and
   a power splitter switchably coupled to the first LNA load circuit, the power splitter comprising a negatively coupled transformer, wherein the negatively coupled transformer comprises a first inductor and a second inductor, and further wherein the first inductor is switchably coupled to a first output and the second inductor is switchably coupled to a second output.

2. The wireless communication device of claim 1, wherein the first inductor is tapped at a first point and negatively coupled to the second inductor tapped at a second point and the power splitter further comprises a tuning component.

3. The wireless communication device of claim 2, in which the tuning component comprises a variable capacitor and a variable resistor.

4. The wireless communication device of claim 2, in which the negatively coupled transformer includes at least one additional tapping point.

5. The wireless communication device of claim 1, in which the first LNA load circuit comprises a plurality of different tapping points, a first tapping point matched to the power splitter and a second tapping point matched to at least one of the outputs first output and the second output.

6. The wireless communication device of claim 1, in which the first LNA load circuit comprises a variable capacitor and a transformer.

7. The wireless communication device of claim 1, further comprising at least one switch configured to couple the first LNA load circuit to the one or more of the outputs.

8. The wireless communication device of claim 1, further comprising:
   a second LNA; and
   a second LNA load circuit coupled to an output of the second LNA and switchably coupled to the power splitter.

9. The wireless communication device of claim 8, in which the second LNA load circuit comprises a variable capacitor and a transformer, the transformer tapped in at least two different points.

10. The wireless communication device of claim 1, further comprising at least one controller configured to control at least one component of the first LNA load circuit or the power splitter.

11. A method for isolating outputs in a wireless communication device, comprising:
    selectively supplying an amplified signal to a power splitter, the power splitter comprising a negatively coupled transformer, wherein the negatively coupled transformer comprises a first inductor and a second inductor, and further wherein the first inductor is switchably coupled to a first output and the second inductor is switchably coupled to a second output; and
    isolating the first output and the second output when the amplified signal is supplied to the power splitter.

12. The method of claim 11, in which the selectively supplying is based at least in part on a mode of operation.

13. The method of claim 12, in which the amplified signal is supplied to the power splitter in an intra carrier aggregation (CA) mode.

14. The method of claim 11, in which the isolating is based at least in part on a coupling factor.

15. A wireless communication device, comprising:
    means for selectively supplying an amplified signal to a power splitter, the power splitter comprising a negatively coupled transformer, wherein the negatively coupled transformer comprises a first inductor and a second inductor, and further wherein the first inductor is switchably coupled to a first output and the second inductor is switchably coupled to a second output; and
    means for isolating the first output and the second output when the amplified signal is supplied to the power splitter.

16. The device of claim 15, in which the means for selectively supplying supplies is configured to supply the amplified signal based at least in part on a mode of operation.

17. The device of claim 16, in which the means for selectively supplying is configured to supply the amplified signal to the power splitter in an intra carrier aggregation (CA) mode.

18. The device of claim 15, in which the means for isolating isolates the one or more outputs based at least in part on a coupling factor.

19. The wireless communication device of claim 1, further wherein the negatively coupled transformer is configured such that a positive change in current flowing from a first terminal to a second terminal of the first inductor results in a negative change in voltage drop from a first terminal to a second terminal of the second inductor, wherein the second terminal of the first inductor is switchably connected to the first output and the second terminal of the second inductor is switchably connected to the second output.

20. The wireless communication device of claim 15, further wherein the negatively coupled transformer is configured such that a positive change in current flowing from a first terminal to a second terminal of the first inductor results in a negative change in voltage drop from a first terminal to a second terminal of the second inductor, wherein the second terminal of the first inductor is switchably connected to the first output and the second terminal of the second inductor is switchably connected to the second output.

* * * * *